(12) United States Patent
Kajita

(10) Patent No.: US 9,973,171 B2
(45) Date of Patent: May 15, 2018

(54) DIGITAL FILTER

(71) Applicant: Azbil Corporation, Chiyoda-ku (JP)

(72) Inventor: Tetsuya Kajita, Chiyoda-ku (JP)

(73) Assignee: Azbil Corporation, Chiyoda-ku (JP)

( * ) Notice: Subject to any disclaimer, the term of this patent is extended or adjusted under 35 U.S.C. 154(b) by 0 days. days.

(21) Appl. No.: 15/316,807

(22) PCT Filed: May 15, 2015

(86) PCT No.: PCT/JP2015/063979
§ 371 (c)(1),
(2) Date: Dec. 6, 2016

(87) PCT Pub. No.: WO2015/190216
PCT Pub. Date: Dec. 17, 2015

(65) Prior Publication Data
US 2017/0201236 A1    Jul. 13, 2017

(30) Foreign Application Priority Data

Jun. 13, 2014 (JP) ................................. 2014-122174

(51) Int. Cl.
*H03H 17/02* (2006.01)
*H03M 3/02* (2006.01)
(52) U.S. Cl.
CPC ...... *H03H 17/025* (2013.01); *H03H 17/0282* (2013.01); *H03M 3/02* (2013.01)
(58) Field of Classification Search
CPC ............. H03H 17/025; H03H 17/0282; H03H 17/0288; H03M 3/02
See application file for complete search history.

(56) References Cited

U.S. PATENT DOCUMENTS 4,872,129 A * 10/1989 Pfeifer ............... H03H 17/0657
708/313
4,999,798 A * 3/1991 McCaslin .......... H03H 17/0671
708/313

(Continued)

FOREIGN PATENT DOCUMENTS

JP    62-43205 A    2/1987
JP    4-313908 A    11/1992
JP    4-360410 A    12/1992

OTHER PUBLICATIONS

International Search Report dated Jun. 9, 2015 in PCT/JP2015/063979.

(Continued)

*Primary Examiner* — Patrick O'Neill
(74) *Attorney, Agent, or Firm* — Oblon, McClelland, Maier & Neustadt, L.L.P.

(57) ABSTRACT

A digital filter includes integrator circuits configured to operate based on a clock of a sampling frequency $f_S$ that is equal to a sampling frequency of input data and determine a sum of the input data on a sample-by-sample basis, a frequency converter circuit configured to perform decimation on data of the sampling frequency $f_S$ to reduce the sampling frequency $f_S$ to a sampling frequency $f_D=f_S/N$, one or more differentiator circuits configured to operate based on a clock of the sampling frequency $f_D$ and subtract data of an immediately preceding sample from the input data, a differentiator circuit for removal of 50 Hz configured to operate based on the clock of the sampling frequency $f_D$ and subtract, from the input data, data preceding the input data by a plurality of samples, and a differentiator circuit for removal of 60 Hz configured to operate based on a clock of the sampling frequency $f_D$ and subtract, from the input data, data preceding the input data by a plurality of samples.

4 Claims, 5 Drawing Sheets

(56) References Cited

U.S. PATENT DOCUMENTS

| | | | | |
|---|---|---|---|---|
| 5,381,356 | A * | 1/1995 | Takahashi | H03H 17/026 |
| | | | | 708/306 |
| 6,408,318 | B1 * | 6/2002 | Fang | H03H 17/0664 |
| | | | | 708/313 |
| 7,047,263 | B2 * | 5/2006 | Todsen | H03H 17/0283 |
| | | | | 708/313 |
| 9,432,043 | B2 * | 8/2016 | O'Shaughnessy | H03H 17/0664 |

OTHER PUBLICATIONS

Shogo Nakamura, "Beginners Digital Filter" Tokyo Denki University Press, Nov. 30, 1989, pp. 154-165 and p. 178.

Chen Rujun, et al., "Customized Decimation and Multi-fold Notch Filters Realized by DSP56309" International Conference on Computer and Electrical Engineering, Dec. 22, 2008, pp. 327-330.

James C. Candy, et al., "Oversampling Delta-Sigma Data Converters Theory, Design, and Simulation" IEEE Circuits and Systems Society, 1991, pp. 1-29 with cover pages.

* cited by examiner

DIGITAL FILTER

TECHNICAL FIELD

The present invention relates to digital filters and more particularly to a digital filter including a combination of a SINC filter and a notch filter.

BACKGROUND ART

SINC filters are well known as decimation filters used in ΔΣ A/D converters. SINC filters can be represented by using a transfer function of $(1-z^{-N})/(1-z^{-1})$. The effect of noise shaping is successfully enhanced by increasing the order of a ΔΣ modulator used in ΔΣ A/D converters. However, it is well known that the order of a decimation filter (SINC filter) at the subsequent stage needs to be higher than the order of the ΔΣ modulator.

For example, an A/D converter using a second-order ΔΣ modulator is considered now. A third-order filter is needed as a SINC filter as illustrated in FIG. 7. This SINC filter can be represented by a transfer function of $\{(1-z^{-N})/(1-z^{-1})\}^3$. It is also well known that integrator units that constitute the denominator part of the transfer function and differentiator units that constitute the numerator part of the transfer function are separated from each other, and the differentiator units are disposed to follow down-sampling at a frequency of 1/N. In the example illustrated in FIG. 7, the SINC filter includes three integrator units 100 connected in cascade, three differentiator units 101 connected in cascade, and a frequency converter unit 102 that connects the cascade of the integrator units 100 and the cascade of the differentiator units 101 to each other. The integrator units 100 operate at a sampling frequency of $f_S$. The differentiator units 101 and the frequency converter unit 102 operate at a sampling frequency of $f_D=f_S/N$.

Filters for removing the utility frequency of 50 Hz/60 Hz are often needed in manufacturing-related applications, such as industrial applications. Band-limit filters or notch filters are known as filters that remove a specific frequency, such as 50 Hz/60 Hz. Notch filters can be implemented as digital circuits as illustrated in FIGS. 8 and 9 although these filters can be implemented also as analog circuits.

A notch filter that removes a 50-Hz component contained in input data includes a differentiator unit 200 and an integrator unit 201 as illustrated in FIG. 8. In the example in FIG. 8, the 50-Hz (=20 ms) frequency component is successfully removed from data sampled at a sampling frequency of 100 Hz, that is, data having a period of 10 ms, by connecting in cascade two delay units of the differentiator unit 200 and determining a difference between data of interest and data preceding the data of interest by two samples (see Literature [Shogo NAKAMURA, "Digital Filters for Beginners", Tokyo Denki University Press, pp. 154-165, 1989]).

A notch filter that removes a 60-Hz component contained in input data includes a differentiator unit 300 and an integrator unit 301 as illustrated in FIG. 9. In the example in FIG. 9, the 60-Hz frequency component is successfully removed from data having a period of 10 ms by connecting in cascade five delay units of the differentiator unit 300 and determining a difference between data of interest and data preceding the data of interest by five samples.

A utility-frequency-removed conversion result is successfully obtained by disposing both or one of the notch filters illustrated in FIGS. 8 and 9 at the subsequent stage of the SINC filter illustrated in FIG. 7 in combination. In countries where both utility frequencies of 50 Hz and 60 Hz are used, such as in Japan, both 50 Hz and 60 Hz need to be successfully removed. Accordingly, a notch filter that removes 50 Hz and a notch filter that removes 60 Hz need to be connected in series as illustrated in FIG. 10. Configurations such as automatically determining whether the utility frequency is 50 Hz or 60 Hz to select the property of the notch filter or the user setting the property of notch filter by using a switch or the like are possible; however, addition of an extra detection circuit or putting an extra load on the user is not preferable.

In the configuration in FIG. 10, since both the integrator units and the differentiator units are configured as digital circuits, the signal line has a width of a plurality of bits. The bit width needs to be selected so as to prevent the occurrence of an internal overflow. The bit width is dependent on a down-sampling frequency ratio N, and a bit width of K×log 2(N)+1 [bit] is needed (see Literature [J. C. Candy and G. C. Temes, "Oversampling Delta-Sigma Data Converters", IEEE Press, pp. 1-29, 1991]). Here, K denotes the number of stages of the filter. When the SINC filter is a third-order filter as illustrated in FIGS. 7 and 10, K is equal to 3. For example, if an accuracy of 16 bits is desired in the case of N=256, 25 bits are needed. Thus, a register corresponding to such a bit width is necessary.

SUMMARY OF INVENTION

Technical Problem

As described above, digital filters require a register corresponding to the bit width of data. The circuit scale of an adder circuit and a subtracter circuit for data stored on the register also increases as the bit width increases. Since desires for a higher bit resolution and a higher accuracy are strong in industrial applications, output of digital filters is often 16 bits to 24 bits wide. Thus, the circuit scale increases significantly. In the case where the ΔΣ A/C converter is implemented as an integrated circuit, the chip area increases, which leads to an increased chip price and ultimately imposes an economic burden.

The present invention has been made to solve the issues described above and aims to reduce the circuit scale of a digital filter including a combination of a SINC filter and a notch filter.

Solution to Problem

A digital filter according to the present invention includes a plurality of integrator units connected in cascade, the plurality of integrator units being configured to operate based on a clock of a sampling frequency $f_S$ that is equal to a sampling frequency of input data and configured to determine a sum of the input data on a sample-by-sample basis; a frequency converter unit configured to perform decimation on data of the sampling frequency $f_S$ input from a last integrator unit among the plurality of integrator units connected in cascade to reduce the sampling frequency $f_S$ to a sampling frequency $f_D=f_S/N$ (where N is an integer of 2 or greater); a plurality of first differentiator units connected in cascade or a single first differentiator unit configured to operate based on a clock of the sampling frequency $f_D$ and configured to subtract data of an immediately preceding sample from data input from the frequency converter unit; a second differentiator unit for removal of a specific frequency, the second differentiator unit being configured to operate based on a clock of the sampling frequency $f_D$ and configured to subtract, from data input from a last first differentiator unit among the plurality of first differentiator units connected in cascade or from the single first differentiator unit, data preceding the input data by a plurality of samples.

Advantageous Effects of Invention

According to the present invention, the circuit scale of a digital filter including a combination of a SINC filter and a notch filter is successfully reduced by configuring the digital filter to include a plurality of integrator units connected in cascade, a frequency converter unit, a plurality of first differentiator units connected in cascade or a single first differentiator unit, and a second differentiator unit.

DESCRIPTION OF EMBODIMENTS

[Principle of Invention]

Figure 1A:
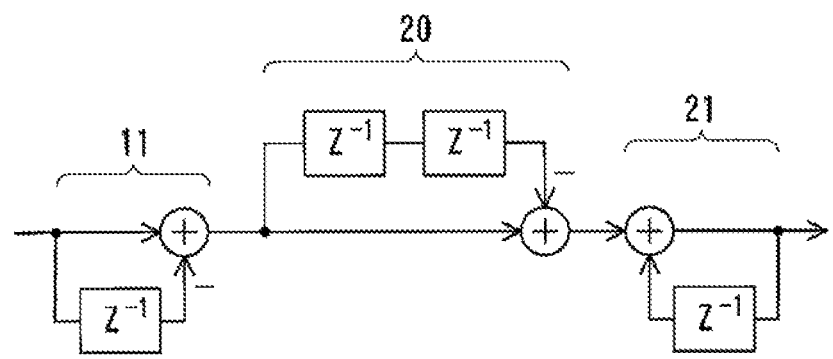
FIGS. 1A and 1B are diagrams for describing the principle of how a differentiator unit of a SINC filter and an integrator unit of a notch filter are merged together in accordance with the present invention.
Figure 1B:
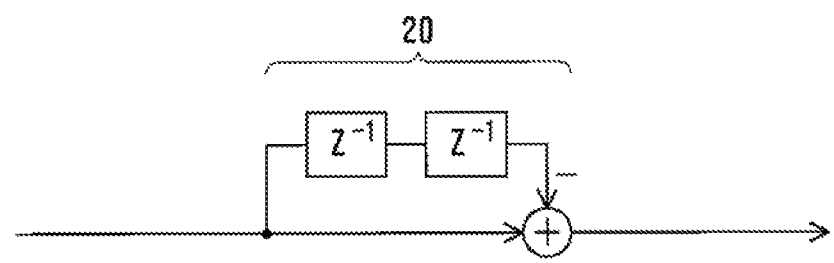

FIGS. 1A and 1B are diagrams for describing the principle of the present invention. FIG. 1A illustrates a differentiator unit 11 of a SINC filter and a notch filter connected at the subsequent stage of this SINC filter. The notch filter includes a differentiator unit 20 and an integrator unit 21. In the present invention, the circuit scale of a digital filter is reduced by merging together (cancelling out) the differentiator unit 11 of the SINC filter and the integrator unit 21 of the notch filter. In the example in FIG. 1B, only the differentiator unit 20 of the notch filter that removes 50 Hz is left as a result of the merger of the differentiator unit 11 and the integrator unit 21. This merger can be represented by a transfer function below.

$$(1-z^{-1}) \cdot \{(1-z^{-2})/(1-z^{-1})\} = 1-z^{-2}$$

The notch filter illustrated in the example in FIGS. 1A and 1B assumes sampling at a period of 10 ms. The cutoff frequency of the filter or the like can be changed by the sampling frequency; however, the configuration of the notch filter is determined by the utility frequency, that is, the absolute frequency value. Accordingly, the sampling frequency is uniquely determined by the hardware configuration.

Figure 2:
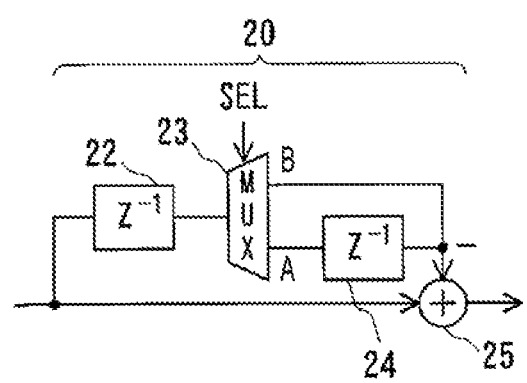
FIG. 2 is a diagram for describing the principle of how the notch filter is switched to be enabled/disabled in accordance with the present invention.

Specifically, when it is necessary to set the sampling frequency to another frequency, the configuration needs to be changed so that the notch filter that removes 50/60 Hz is not used. In such applications, the expected result of the SINC filter is also not obtained if the configuration of FIGS. 1A and 1B is used without any modification. Accordingly, a selection signal SEL based on whether or not to use the notch filter is used to make it possible to select whether to use the notch filter as illustrated in FIG. 2.

Specifically, when a multiplexer 23 is caused to select the A side in accordance with the selection signal SEL, a delay unit 22 and a delay unit 24 are connected in series. Thus, the differentiator unit 20 illustrated in FIG. 2 functions as a differentiator unit of the notch filter that removes 50 Hz. On the other hand, when the multiplexer 23 is caused to select the B side, the delay unit 24 is disconnected from the signal path. Thus, the differentiator unit 20 illustrated in FIG. 2 no longer functions as the notch filter and functions as the differentiator unit of the SINC filter.

Likewise, an integrator unit of a notch filter that removes 60 Hz and a differentiator unit of a SINC filter can also be merged together.

First Embodiment

Figure 3:
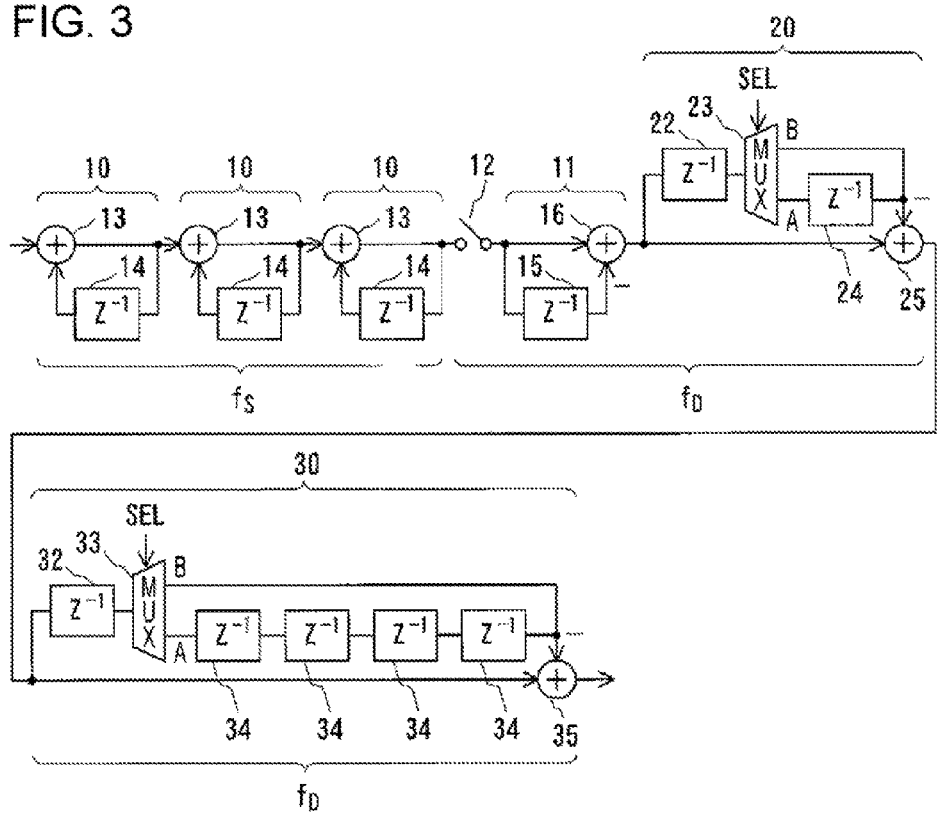
FIG. 3 is a block diagram illustrating the configuration of a digital filter according to a first embodiment of the present invention.

Embodiments of the present invention will be described below with reference to the drawings. FIG. 3 is a block diagram illustrating the configuration of a digital filter according to a first embodiment of the present invention. The digital filter according to the present embodiment includes a plurality of integrator units 10 connected in cascade, a plurality of differentiator units 11 connected in cascade or a single differentiator unit 11, a frequency converter unit 12, the differentiator unit 20 that removes 50 Hz, and a differentiator unit 30 that removes 60 Hz. The plurality of integrator units 10 operate based on a clock of a sampling frequency $f_S$ that is equal to the sampling frequency of data input to the digital filter and determine the sum of the input data on a sample-by-sample basis. The plurality of differentiator units 11 or the single differentiator unit 11 operates based on a clock of a sampling frequency $f_D = f_S/N$ and subtracts data of the immediately preceding sample from the input data. The frequency converter unit 12 is disposed between an output of the last integrator unit 10 and an input of the first differentiator unit 11 and performs decimation on the data of the sampling frequency $f_S$ that is input from the last integrator unit 10 so as to reduce the sampling frequency $f_S$ to the sampling frequency $f_D$. The differentiator unit 20 operates based on a clock of the sampling frequency $f_D$ and subtracts, from the data input from the differentiator unit 11, data preceding the input data by a plurality of samples. The differentiator unit 30 operates based on a clock of the sampling frequency $f_D$ and subtracts, from the data input from the differentiator unit 20, data preceding the input data by a plurality of samples.

Each of the integrator units 10 includes an adder unit 13 and a delay unit 14. The adder unit 13 adds data of the sampling frequency $f_S$ that is input to the integrator unit 10 to the result of the sum up to data of the immediately preceding sample. The delay unit 14 delays the resulting sum output from the adder unit 13 by one sample (period of the clock of the sampling frequency $f_S$) and then inputs the resulting sum to the adder unit 13. In this way, each of the integrator units 10 determines the sum of data input thereto at each clock of the sampling frequency $f_S$.

For example, in the case of using the digital filter according to the present embodiment as a decimation filter at the subsequent stage of a ΔΣ modulator, the number i of integrator units 10 (i.e., the order of the SINC filter, where i is an integer of 2 or greater and i=3 in the present embodiment) needs to be higher than the order of the ΔΣ modulator. In addition, since the differentiator unit of the SINC filter and the integrator unit of the notch filter that removes 50 Hz are cancelled out and the differentiator unit of the SINC filter and the integrator unit of the notch filter that removes 60 Hz are cancelled out in the present embodiment, at least the number of integrator units 10 corresponding to the number of differentiator units of the SINC filter that are to be cancelled out are needed. Accordingly, the minimum value of the number i of integrator units 10 (order) is equal to 2.

The frequency converter unit 12 is switched on in synchronization with the clock of the sampling frequency $f_D=f_S/N$ (where the down-sampling frequency ratio N is an integer of 2 or greater) and performs decimation (down-sampling) on data to convert the data of the sampling frequency $f_S$ output from the last integrator unit 10 into data of the sampling frequency $f_D$.

The differentiator unit 11 includes a delay unit 15 and a subtracter unit 16. The delay unit 15 delays data of the sampling frequency $f_D$ input from the frequency converter unit 12 to the differentiator unit 11 by one sample (period of the clock of the sampling frequency $f_D$). The subtracter unit 16 subtracts output data of the delay unit 15 from the data input to the differentiator unit 11. With this configuration, the differentiator unit 11 subtracts, from data input to the differentiator unit 11, data of the immediately preceding sample.

The integrator units 10, the differentiator unit 11, and the frequency converter unit 12 constitute a SINC filter; however, since the differentiator unit of the SINC filter and the integrator unit of the notch filter that removes 50 Hz are cancelled out and the differentiator unit of the SINC filter and the integrator unit of the notch filter that removes 60 Hz are cancelled out as described above, the number of differentiator units 11 is equal to (i−2). Accordingly, in the case of i=2, no differentiator unit 11 is needed. In this case, the output of the frequency converter unit 12 and the input of the differentiator unit 20 are connected to each other. When the differentiator unit(s) 11 is (are) provided, the number i of integrator units 10 is greater than or equal to 3.

The differentiator unit 20 includes the delay unit 22, the multiplexer 23, the single delay unit or plurality of delay units 24 connected in cascade, and an adder unit 25. The delay unit 22 delays the data of the sampling frequency $f_D$ input from the differentiator unit 11 to the differentiator unit 20 by one sample (period of the clock of the sampling frequency $f_D$). The multiplexer 23 outputs the output data of the delay unit 22 to a first output terminal or a second output terminal in accordance with the selection signal SEL. The single delay unit 24 or each of the plurality of delay units 24 delays the output data of the first output terminal of the multiplexer 23 by one sample (period of the clock of the sampling frequency $f_D$). The adder unit 25 adds together the data input to the differentiator unit 20, the output data of the delay unit 24, and the output data of the second output terminal of the multiplexer 23. In the case of providing a plurality of differentiator units 11 connected in cascade, the output data of the last differentiator unit 11 is input to the differentiator unit 20. In the case of providing a single differentiator unit 11 as illustrated in FIG. 3, the output data of this differentiator unit 11 is input to the differentiator unit 20. In addition, in the case of providing a plurality of delay units 24 connected in cascade, the output data of the last delay unit 24 is input to the adder unit 25. In addition, in the case of providing a single delay unit 24 as illustrated in FIG. 3, the output data of this delay unit 24 is input to the adder unit 25.

As described above, when the multiplexer 23 is caused to select the A side (first output terminal side) in accordance with the selection signal SEL, the delay unit 22 and the delay unit 24 are connected in series. Thus, the differentiator unit 20 functions as the differentiator unit of the notch filter that removes 50 Hz. On the other hand, when the multiplexer 23 is caused to select the B side (second output terminal side) in accordance with the selection single SEL, the differentiator unit 20 no longer function as the notch filter and functions as the differentiator unit of the SINC filter.

There is always a single delay unit 22. The total number j of delay units 22 and 24 (where j is an integer of 2 or greater and j=2 in the present embodiment) may be set so that the 50-Hz component contained in the input data is removable. Accordingly, the number j changes depending on the sampling frequency $f_D$.

The differentiator unit 30 includes a delay unit 32, a multiplexer 33, a plurality of delay units 34 connected in cascade or a single delay unit 34, and an adder unit 35. The delay unit 32 delays the data of the sampling frequency $f_D$ input from the differentiator unit 20 to the differentiator unit 30 by one sample (period of the clock of the sampling frequency $f_D$). The multiplexer 33 outputs the output data of the delay unit 32 to a first output terminal or a second output terminal in accordance with the selection signal SEL. Each of the plurality of delay units or single delay unit 34 delays the output data of the first output terminal of the multiplexer 33 by one sample (period of the clock of the sampling frequency $f_D$). The adder unit 35 adds together the data input to the differentiator unit 30, the output data of the delay unit 34, and the output data of the second output terminal of the multiplexer 33. In the case of providing a plurality of delay units 34 connected in cascade, the output data of the last delay unit 34 is input to the adder unit 35. In the case of providing a single delay unit 34, the output data of this delay unit 34 is input to the adder unit 35.

When the multiplexer 33 is caused to select the A side (first output terminal side) in accordance with the selection signal SEL, the delay unit 32 and the delay unit 34 are connected in series. Thus, the differentiator unit 30 functions as the differentiator unit of the notch filter that removes 60 Hz. On the other hand, when the multiplexer 33 is caused to select the B side (second output terminal side) in accordance with the selection signal SEL, the differentiator unit 30 no longer functions as the notch filter and functions as the differentiator unit of the SINC filter.

There is always a single delay unit 32. The total number k of delay units 32 and 34 (where k is an integer of 2 or greater and k=5 in the present embodiment) may be set so that the 60-Hz component contained in the input data is removable. Accordingly, the number k changes depending on the sampling frequency $f_D$.

As described above, the circuit scale of a digital filter including a combination of a SINC filter and notch filters is successfully reduced in the present embodiment by cancelling out a differentiator unit of the SINC filter and an integrator unit of the notch filter that removes 50 Hz and cancelling out a differentiator unit of the SINC filter and an integrator unit of the notch filter that removes 60 Hz.

In addition, the configuration is successfully changed so as to use neither the notch filter that removes 50 Hz nor the notch filter that removes 60 Hz by including the multiplexers 23 and 33 in the differentiator units 20 and 30, respectively, and causing the multiplexers 23 and 33 to select the B side in accordance with the selection signal SEL when it is necessary to set the sampling frequency $f_D$ to another frequency different from the designed frequency (100 Hz in this embodiment).

Second Embodiment

Figure 4A:
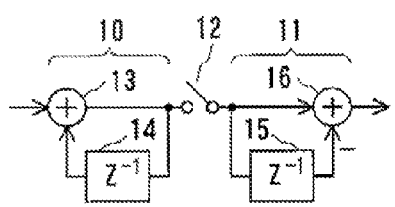
FIGS. 4A, 4B, and 4C are diagrams for describing the principle of how the configuration is simplified in accordance with a second embodiment of the present invention.
Figure 4B:
Figure 4C:
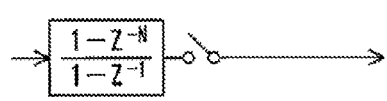
Figure 5:
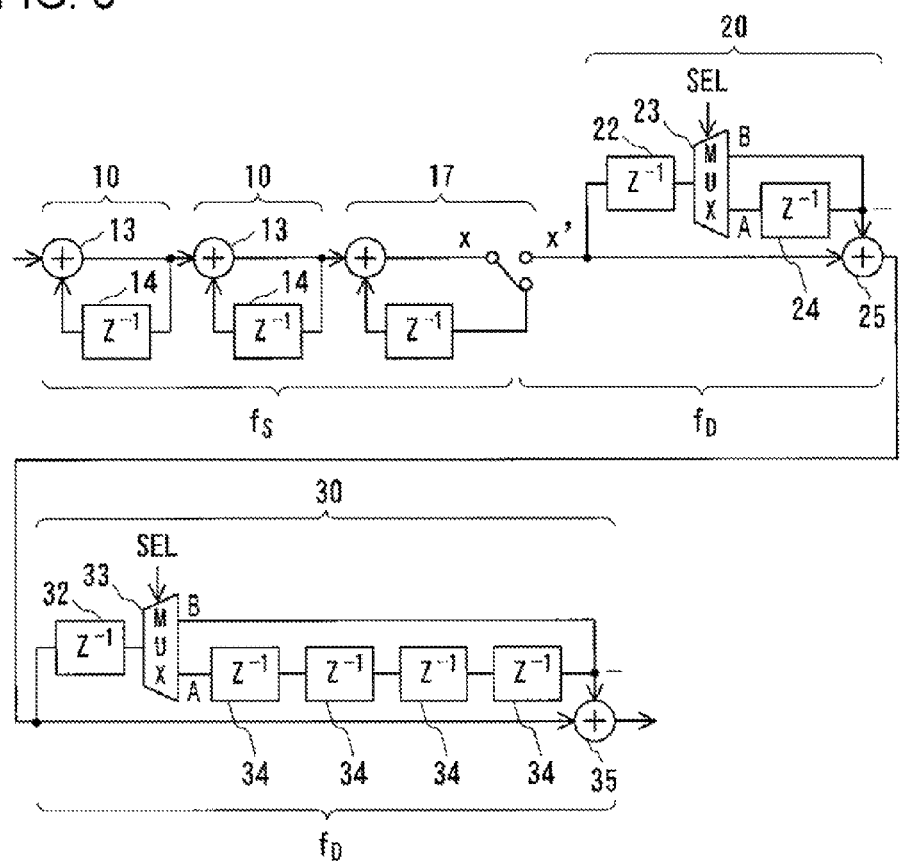
FIG. 5 is a block diagram illustrating the configuration of a digital filter according to the second embodiment of the present invention.

A second embodiment of the present invention will be described next. The configuration of the last integrator unit 10, the frequency converter unit 12, and the differentiator unit 11 (FIG. 4A) in the digital filter according to the first embodiment can be transformed as illustrated in FIG. 4B and can be ultimately transformed as illustrated in FIG. 4C. The digital filter according to the first embodiment is successfully simplified as illustrated in FIG. 5 by using the principle of such transformation.

In the present embodiment, an integrator and frequency converter unit 17 is used in place of the last integrator unit 10, the frequency converter unit 12, and the differentiator unit 11 illustrated in FIG. 3. In the case of providing a plurality of differentiator units 11 connected in cascade, the integrator and frequency converter unit 17 may be provided in place of the last integrator unit 10, the frequency converter unit 12, and the first differentiator unit 11.

The integrator and frequency converter unit 17 determines the sum of data of the sampling frequency $f_S$ input from the preceding integrator unit 10 at each clock of the sampling frequency $f_S$ and outputs the resulting sum to the differentiator unit 20 at each clock of the sampling frequency $f_D$.

Figure 6:
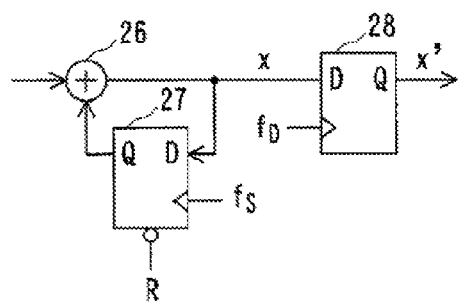
FIG. 6 is a block diagram illustrating the configuration of an integrator and frequency converter unit of the digital filter according to the second embodiment of the present invention.
Figure 7:
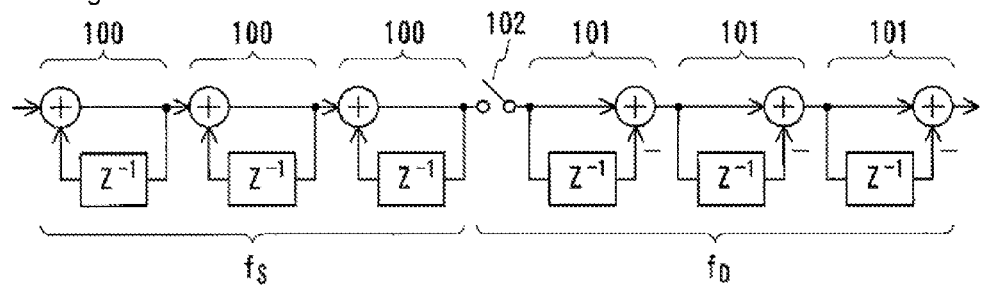
FIG. 7 is a block diagram illustrating the configuration of a SINC filter according to the related art.
Figure 8:
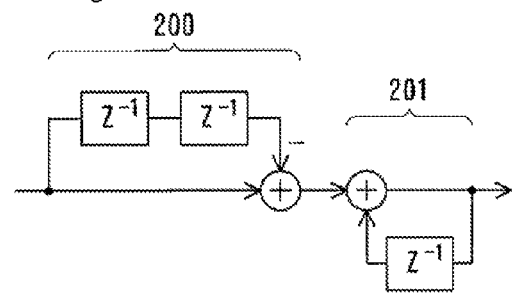
FIG. 8 is a block diagram illustrating the configuration of a notch filter that removes 50 Hz according to the related art.
Figure 9:
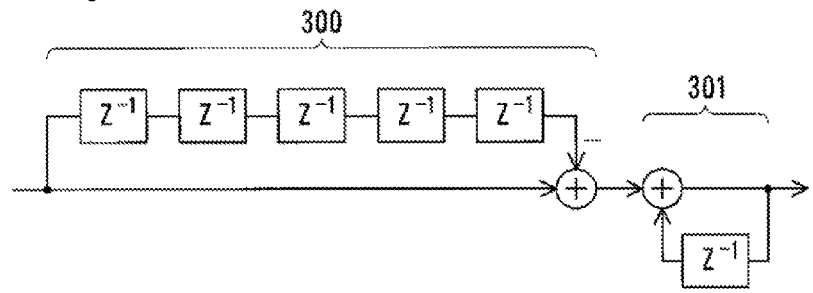
FIG. 9 is a block diagram illustrating the configuration of a notch filter that removes 60 Hz according to the related art.
Figure 10:
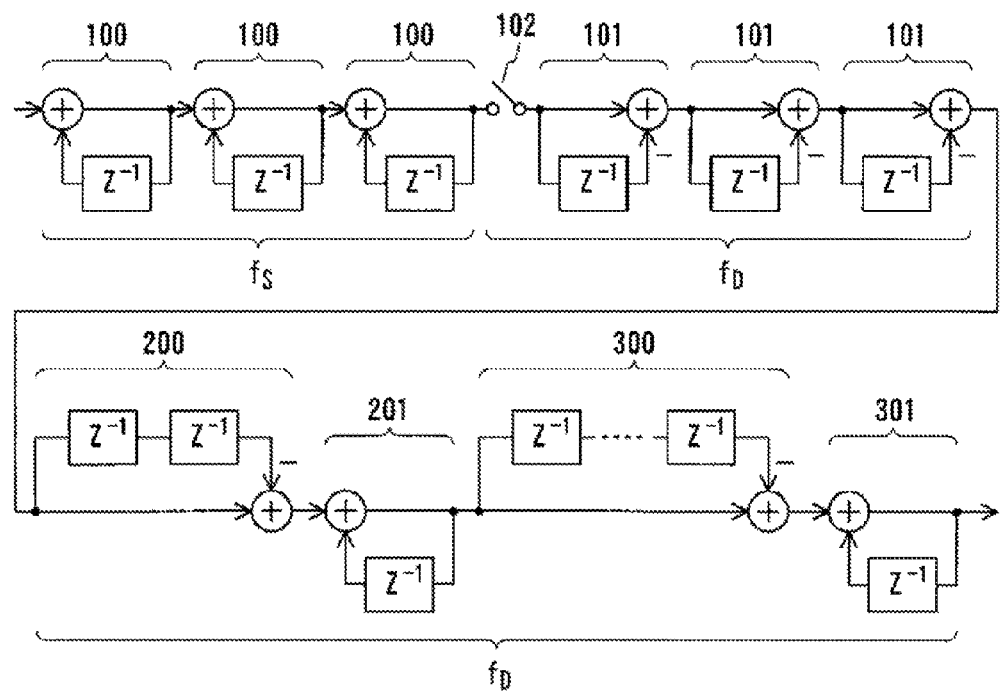
FIG. 10 is a block diagram illustrating the configuration of a combination of a SINC filter and notch filters.

FIG. 6 is a block diagram illustrating the configuration of the integrator and frequency converter unit 17. The integrator and frequency converter unit 17 includes an adder unit 26, a flip-flop 27, and a flip-flop 28. The adder unit 26 adds together data of the sampling frequency $f_S$ input to the integrator and frequency converter unit 17 and the result of the sum up to data of the immediately preceding sample. The flip-flop 27 is a delay unit that delays the resulting sum output from the adder unit 26 by one sample (period of the clock of the sampling frequency $f_S$) and then inputs the resulting sum to the adder unit 26. The flip-flop 28 holds and outputs the output data of the adder unit 26 at each clock cycle of the sampling frequency $f_D$. A reset signal R that is synchronized with the clock of the sampling frequency $f_D$ is input to the flip-flop 27, and the flip-flop 27 is reset at each clock cycle of the sampling frequency $f_D$.

In this way, the digital filter according to the first embodiment is successfully simplified further in the present embodiment. Note that since the integrator and frequency converter unit 17 is used in place of the last integrator unit 10, the frequency converter unit 12, and the differentiator unit 11 illustrated in FIG. 3 in the present embodiment, (i−2−1)≥0 needs to be satisfied. Thus, the total number i of integrator units 10 and integrator and frequency converter unit 17 needs to be greater than or equal to 3.

In addition, in the case where the total number i of integrator units 10 and integrator and frequency converter unit 17 is greater than or equal to 4, (i−2−1)≥1 is satisfied. Thus, a plurality of differentiator units 11 connected in cascade or a single differentiator unit 11 needs to be provided. In this case, (i−2−1) differentiator units 11 need to be inserted in series between the output of the integrator and frequency converter unit 17 and the input of the differentiator unit 20.

The digital filters according to the first and second embodiments are not limited to decimation filters included in ΔΣ A/D converters and are applicable to any field in which a combination of a SINC filter and notch filter(s) is needed.

In addition, the bit width of each signal line from the input to the output of the digital filters illustrated in FIGS. 3 and 5 is not mentioned in the first and second embodiments, respectively; however, the bit width of each signal line is, for example, 16 bits to 24 bits.

In addition, the differentiator unit 20 for removal of 50 Hz is connected to follow the differentiator unit 11, and the differentiator unit 30 for removal of 60 Hz is connected to follow the differentiator unit 20 for removal of 50 Hz in the first and second embodiments; however, the configuration is not limited to this one. The differentiator unit 30 for removal of 60 Hz may be connected to follow the differentiator unit 11, and the differentiator unit 20 for removal of 50 Hz may be connected to follow the differentiator unit 30 for removal of 60 Hz.

In addition, both the differentiator unit 20 for removal of 50 Hz and the differentiator unit 30 for removal of 60 Hz are provided in the first and second embodiments; however, only one of the differentiator unit 20 and the differentiator unit 30 may be provided. When only one of the differentiator unit 20 and the differentiator unit 30 is provided in the first embodiment, the number of differentiator units 11 is equal to (i−1). When only one of the differentiator unit 20 and the differentiator unit 30 is provided in the second embodiment, (i−2) differentiator units 11 may be inserted in series between the output of the integrator and frequency converter unit 17 and the input of the differentiator unit 20 or the differentiator unit 30 if the total number i of integrator units 10 and integrator and frequency converter unit 17 is greater than or equal to 3.

In addition, notch filters each of which removes the utility frequency are provided as notch filters that remove a specific frequency in the first and second embodiments; however, the notch filters used are not limited to these ones. If the number j of delay units 22 and 24 used in the differentiator unit 20 is set so that a specific frequency component contained in input data is removable, a notch filter capable of removing the desired frequency can be implemented. The same applies to the differentiator unit 30.

INDUSTRIAL APPLICABILITY

The present invention is applicable to digital filters.

REFERENCE SIGNS LIST

10 . . . integrator unit; 11, 20, 30 . . . differentiator unit; 12 . . . frequency converter unit; 13, 25, 26, 35 . . . adder unit; 14, 15, 22, 24, 32, 34 . . . delay unit; 16 . . . subtracter unit; 23, 33 . . . multiplexer; 17 . . . integrator and frequency converter unit; 27, 28 . . . flip-flop.

The invention claimed is:
1. A digital filter, comprising:
a plurality of integrator circuits connected in cascade, the plurality of integrator circuits being configured to operate based on a clock of a sampling frequency $f_S$ that is equal to a sampling frequency of input data and configured to determine a sum of the input data on a sample-by-sample basis;

a frequency converter circuit configured to perform decimation on data of the sampling frequency $f_S$ input from a last integrator circuit among the plurality of integrator circuits connected in cascade to reduce the sampling frequency $f_S$ to a sampling frequency $f_D=f_S/N$ (where N is an integer of 2 or greater);

a plurality of first differentiator circuits connected in cascade or a single first differentiator circuit configured to operate based on a clock of the sampling frequency $f_D$ and configured to subtract data of an immediately preceding sample from data input from the frequency converter circuit; and a second differentiator circuit configured to remove a specific frequency, the second differentiator circuit being configured to operate based on a clock of the sampling frequency $f_D$ and configured to subtract, from data input from a last first differentiator circuit among the plurality of first differentiator circuits connected in cascade or from the single first differentiator circuit, data preceding the input data by a plurality of samples, wherein the second differentiator circuit includes
 a first delay circuit configured to delay data input from the preceding first differentiator circuit by one sample,
 a multiplexer configured to output output data of the first delay circuit to a first output terminal or a second output terminal in accordance with a selection signal,
 a single second delay circuit or a plurality of second delay circuits connected in cascade, each configured to delay output data of the first output terminal of the multiplexer by one sample, and
 an adder circuit configured to add together the data input from the preceding first differentiator circuit, output data of the single second delay circuit or of a last second delay circuit among the plurality of second delay circuits connected in cascade, and output data of the second output terminal of the multiplexer.

2. The digital filter according to claim 1, wherein the specific frequency is a utility frequency.

3. A digital filter, comprising:
a plurality of integrator circuits connected in cascade, the plurality of integrator circuits being configured to operate based on a clock of a sampling frequency $f_S$ that is equal to a sampling frequency of input data and configured to determine a sum of the input data on a sample-by-sample basis;

a frequency converter circuit configured to perform decimation on data of the sampling frequency $f_S$ input from a last integrator circuit among the plurality of integrator circuits connected in cascade to reduce the sampling frequency $f_S$ to a sampling frequency $f_D=f_S/N$ (where N is an integer of 2 or greater);

a plurality of first differentiator circuits connected in cascade or a single first differentiator circuit configured to operate based on a clock of the sampling frequency $f_D$ and configured to subtract data of an immediately preceding sample from data input from the frequency converter circuit; and a second differentiator circuit configured to remove a specific frequency, the second differentiator circuit being configured to operate based on a clock of the sampling frequency $f_D$ and configured to subtract, from data input from a last first differentiator circuit among the plurality of first differentiator circuits connected in cascade or from the single first differentiator circuit, data preceding the input data by a plurality of samples, wherein two second differentiator circuits are connected in cascade, one of the two second differentiator circuits is configured to remove a first specific frequency, and the other of the two second differentiator circuits is configured to remove a second specific frequency different from the first specific frequency, wherein the second differentiator circuit connected to follow the first differentiator circuit among the two second differentiator circuits includes
 a first delay circuit configured to delay the data input from the preceding first differentiator circuit by one sample,
 a first multiplexer configured to output output data of this first delay circuit to a first output terminal or a second output terminal in accordance with a selection signal,
 a single second delay circuit or a plurality of second delay circuits connected in cascade, each configured to delay output data of the first output terminal of the first multiplexer by one sample, and
 a first adder circuit configured to add together the data input from the preceding first differentiator circuit, output data of the single second delay circuit or of a last second delay circuit among the plurality of second delay circuits connected in cascade, and output data of the second output terminal of the first multiplexer, and wherein the other second differentiator circuit among the two second differentiator circuits includes
 a third delay circuit configured to delay data input from the preceding second differentiator circuit by one sample,
 a second multiplexer configured to output output data of the third delay circuit to a first output terminal or a second output terminal in accordance with a selection signal,
 a single fourth delay circuit or a plurality of fourth delay circuits connected in cascade, each configured to delay output data of the first output terminal of the second multiplexer by one sample, and
 a second adder circuit configured to add together the data input from the preceding second differentiator circuit, output data of the single fourth delay circuit or of a last fourth delay circuit among the plurality of fourth delay circuits connected in cascade, and output data of the second output terminal of the second multiplexer.

4. The digital filter according to claim 3, wherein the first specific frequency is 50 Hz, and the second specific frequency is 60 Hz.

* * * * *